US011817857B2

(12) United States Patent
Ruff

(10) Patent No.: US 11,817,857 B2
(45) Date of Patent: *Nov. 14, 2023

(54) KEYSTROKE DETECTION DEVICE, KEYBOARD, AND KEYSTROKE DETECTION METHOD

(71) Applicant: CHERRY EUROPE GMBH, Auerbach (DE)

(72) Inventor: Eduard Ruff, Auerbach (DE)

(73) Assignee: Cherry Europe GMBH, Auerbach (DE)

( * ) Notice: Subject to any disclaimer, the term of this patent is extended or adjusted under 35 U.S.C. 154(b) by 158 days.

This patent is subject to a terminal disclaimer.

(21) Appl. No.: 17/499,496

(22) Filed: Oct. 12, 2021

(65) Prior Publication Data

US 2022/0123749 A1 Apr. 21, 2022

(30) Foreign Application Priority Data

Oct. 15, 2020 (DE) .......................... 202020105904.1
Dec. 3, 2020 (DE) .......................... 102020132195.3

(51) Int. Cl.
*H03K 17/975* (2006.01)
*H01H 13/7065* (2006.01)
(Continued)

(52) U.S. Cl.
CPC ......... *H03K 17/975* (2013.01); *G06F 3/0202* (2013.01); *H01F 21/02* (2013.01);
(Continued)

(58) Field of Classification Search
CPC .. H03K 17/975; H03K 17/952; H03K 17/972; H03K 2017/9527;
(Continued)

(56) References Cited

U.S. PATENT DOCUMENTS 3,772,684 A 11/1973 Scantlin
4,300,127 A 11/1981 Bernin
(Continued)

OTHER PUBLICATIONS

U.S. Appl. No. 17/499,500, filed Oct. 6, 2022, Office Action.
(Continued)

*Primary Examiner* — Jermele M Hollington
*Assistant Examiner* — Zannatul Ferdous
(74) *Attorney, Agent, or Firm* — Keller Preece PLLC

(57) ABSTRACT

The invention relates to an apparatus for detecting a key press comprising a circuit substrate, to a key module with a key cap and a movement mechanism, and to a device for detecting the movement of the key cap, wherein this device comprises an electrical resonance circuit with a primary coil and a secondary coil with a short-circuited winding, which secondary coil is moved with the key cap, wherein the primary coil and the secondary coil are inductively coupled to one another, and the strength of the inductive coupling between the primary coil and secondary coil and thus at least one physical variable of the resonance circuit change during the movement of the key cap.

Figure 1:
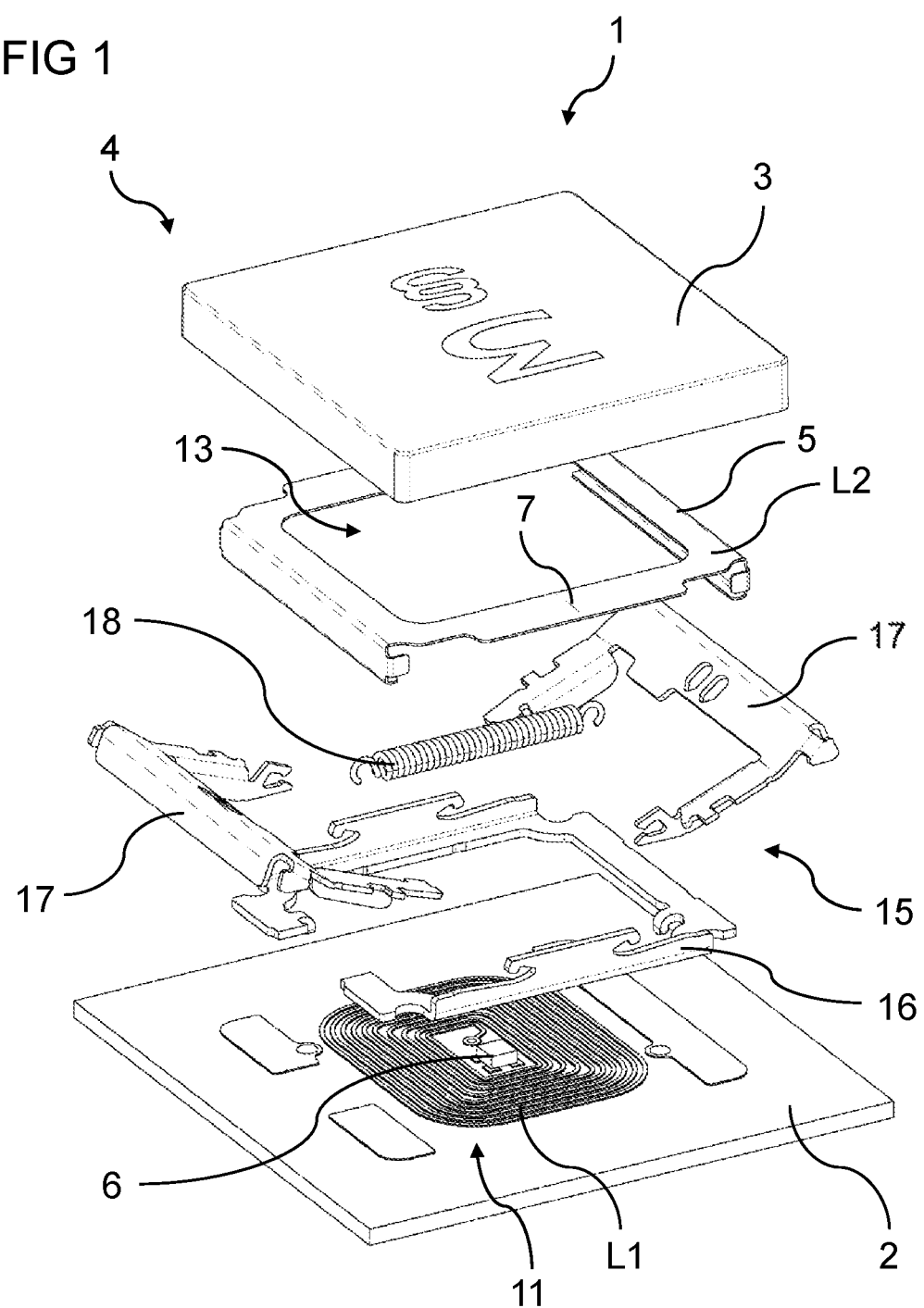

The invention also relates to a keyboard comprising one or more such apparatuses and to a method for detecting a key press.

17 Claims, 12 Drawing Sheets

(51) Int. Cl.
  *G06F 3/02* (2006.01)
  *H01H 13/704* (2006.01)
  *H01F 21/02* (2006.01)
  *H03K 17/95* (2006.01)
  *H03K 17/972* (2006.01)
  *H02J 50/12* (2016.01)
  *H03K 17/97* (2006.01)

(52) U.S. Cl.
  CPC ...... *H01H 13/704* (2013.01); *H01H 13/7065* (2013.01); *H02J 50/12* (2016.02); *H03K 17/952* (2013.01); *H03K 17/972* (2013.01); *H01H 2209/026* (2013.01); *H01H 2239/006* (2013.01); *H03K 2017/9527* (2013.01); *H03K 2017/9706* (2013.01)

(58) Field of Classification Search
  CPC .......... H03K 2017/9706; G06F 3/0202; H01F 21/02; H01H 13/704; H01H 13/7065; H01H 2209/026; H01H 2239/006; H02J 50/12; G01M 13/00
  See application file for complete search history.

(56) References Cited

U.S. PATENT DOCUMENTS

| | | | |
|---|---|---|---|
| 5,233,294 A | 8/1993 | Dreoni | |
| 5,264,809 A | 11/1993 | Tamino | |
| 6,179,938 B1 | 1/2001 | Mannhart et al. | |
| 6,435,763 B1* | 8/2002 | Sakane | E05B 17/147 404/25 |
| 6,852,937 B2 | 2/2005 | Zapf et al. | |
| 7,633,026 B2 | 12/2009 | Zapf et al. | |
| 9,354,620 B2 | 5/2016 | Ben-Shalom et al. | |
| 9,964,395 B2 | 5/2018 | Yamada | |
| 10,379,640 B2 | 8/2019 | Eguchi | |
| 10,630,115 B2 | 4/2020 | Asanuma et al. | |
| 11,372,495 B2 | 6/2022 | Lee et al. | |
| 11,552,635 B2 | 1/2023 | Walsh et al. | |
| 2008/0142346 A1 | 6/2008 | Zapf et al. | |
| 2008/0157756 A1 | 7/2008 | Eissner et al. | |
| 2017/0185173 A1 | 6/2017 | Ito et al. | |
| 2022/0123749 A1* | 4/2022 | Ruff | G06F 3/0202 |

OTHER PUBLICATIONS

Office Action as received in German Application 10 2020 132 195.3 dated Sep. 23, 2021.
Office Action as received in German Application 10 2020 132 196.1 dated Sep. 28, 2021.
Office Action as received in German Application 10 2020 132 198.8 dated Sep. 22, 2021.
U.S. Appl. No. 17/499,500, dated Jun. 5, 2023, Office Action.
U.S. Appl. No. 17/499,502, dated Jun. 26, 2023, Notice of Allowance.

* cited by examiner

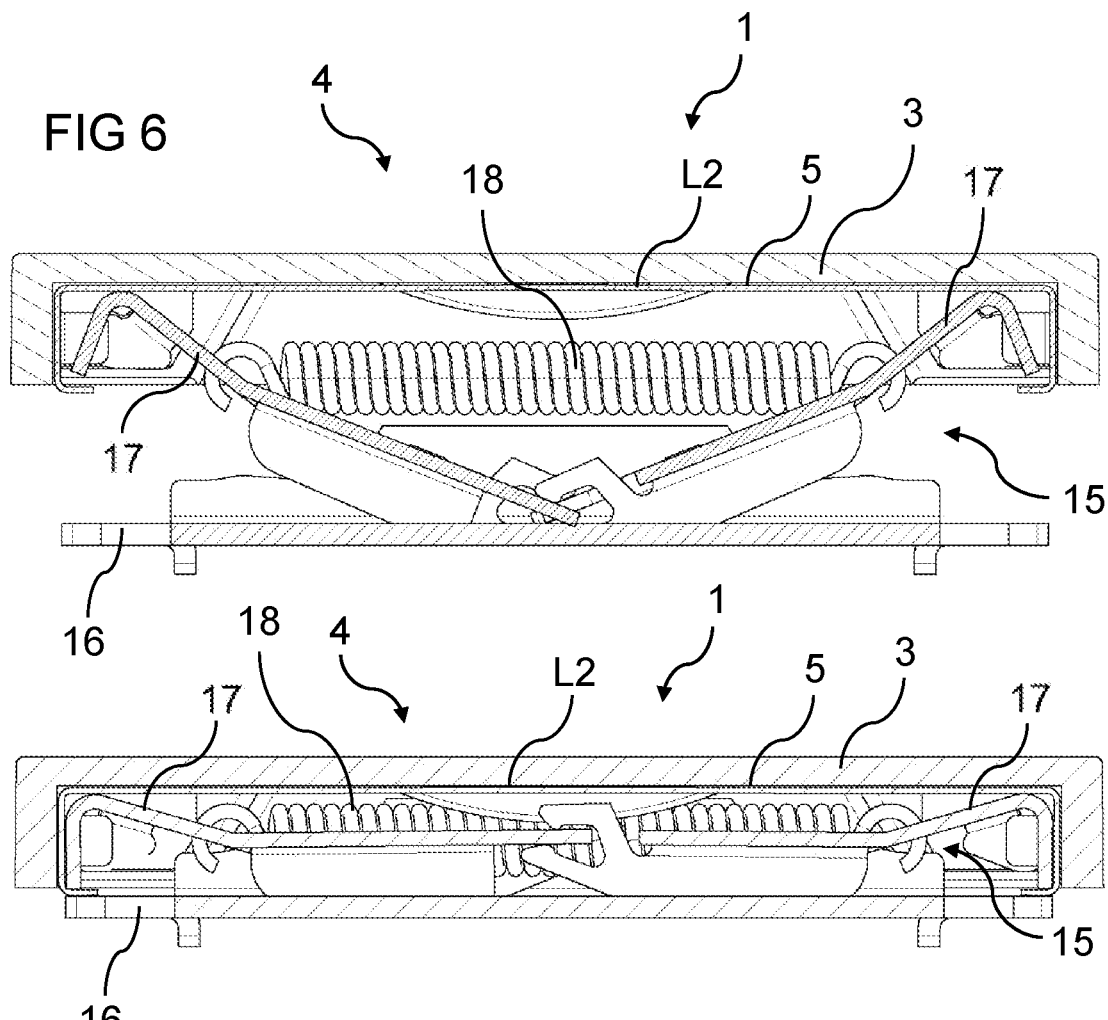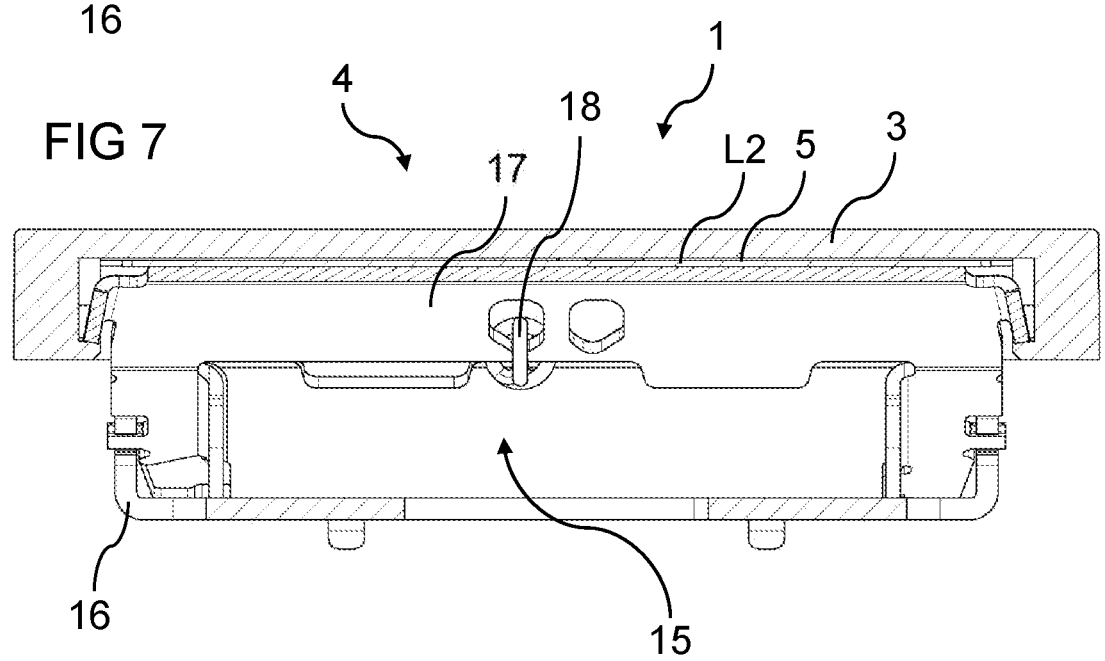

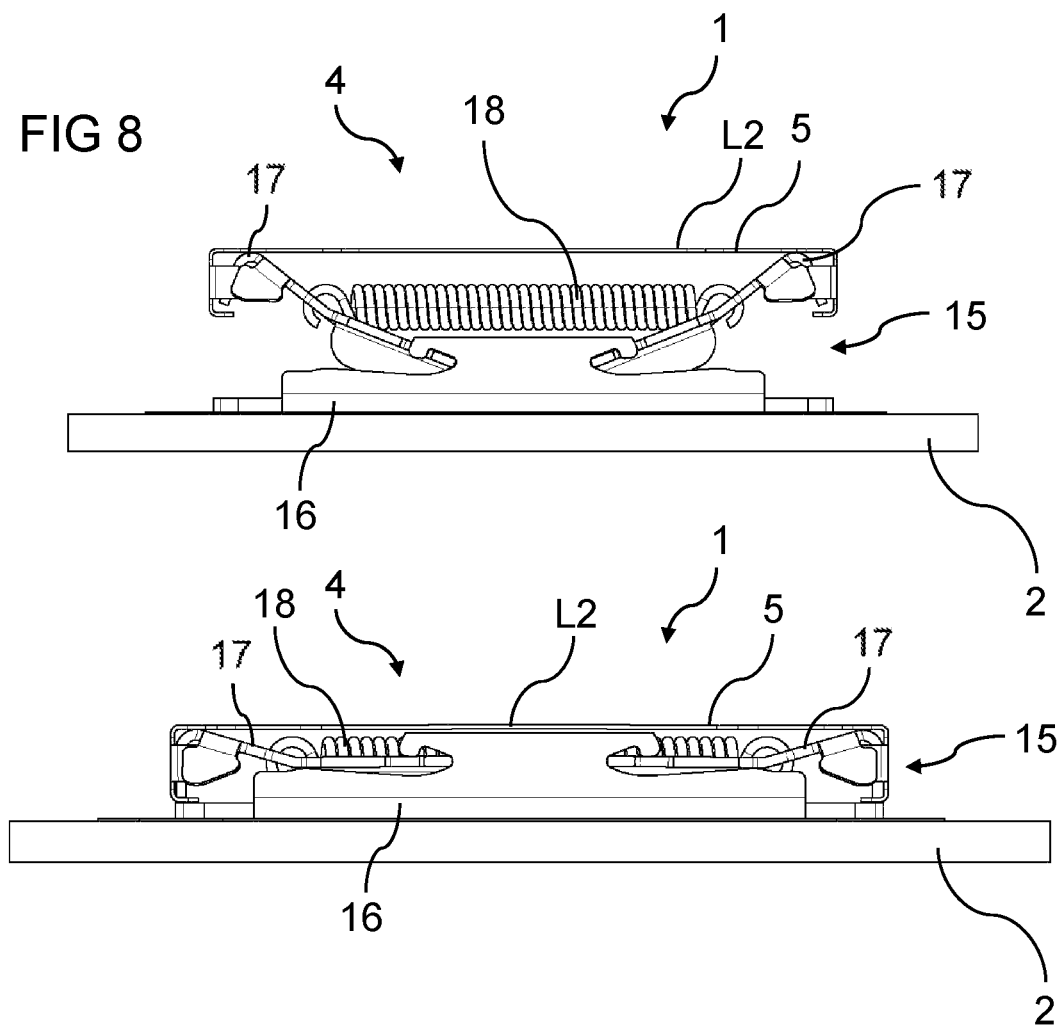

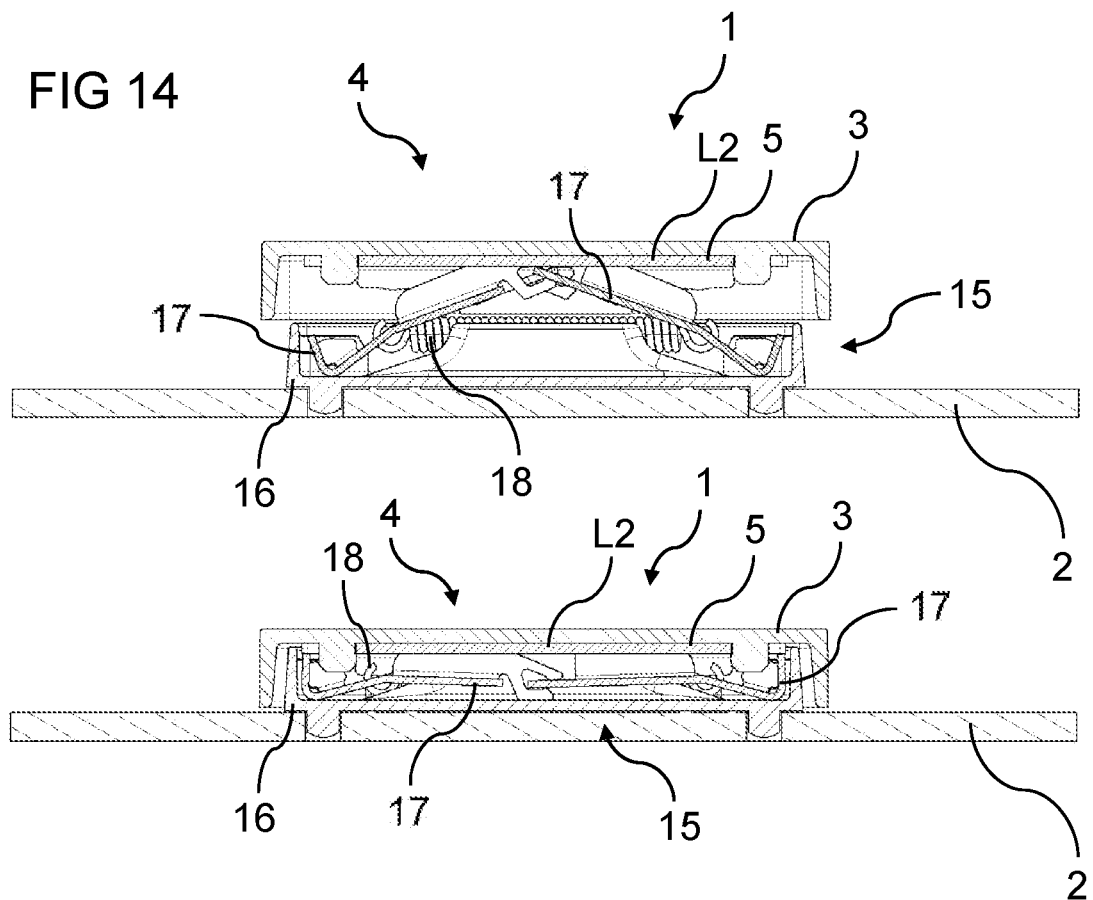
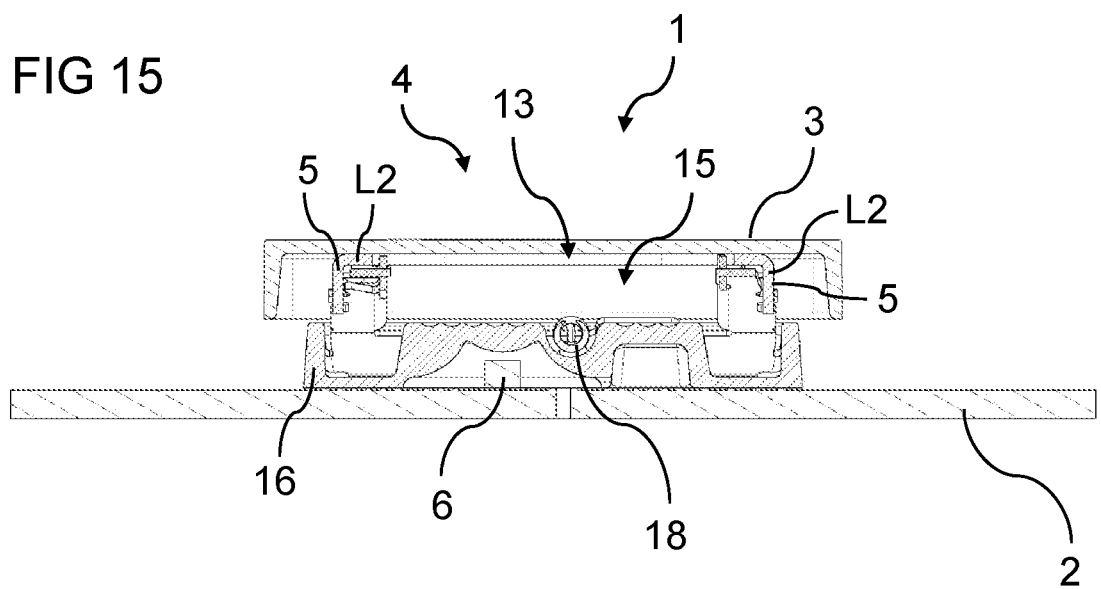

KEYSTROKE DETECTION DEVICE, KEYBOARD, AND KEYSTROKE DETECTION METHOD

The invention relates to an apparatus for detecting a key press, to a keyboard comprising one or more such apparatuses, and to a method for detecting a key press.

A wide variety of types and designs of key modules are used in keyboards. The structural design and the generation of a signal that signals the actuation of a key, for example, are substantial influencing factors on the quality of a key module and thus a keyboard.

Most of the commercially available key modules belong to the so-called mechanical key modules. The following contact system has proven itself for a long time: During the actuation of the key module, two metallic contact surfaces touch each other, which results in a short circuit and triggers a switching signal.

The disadvantage of conventional mechanical key modules is that material wear, in particular mechanical abrasion on the contact surfaces, is unavoidable. As a result, the longer the key modules are used, the more incorrect switching occurs. A break in the contact surfaces has a particularly disadvantageous effect on the functionality of the key modules.

A further disadvantage of a mechanical key module is that only one switching point is provided when it is actuated, i.e. exactly one signal is triggered at a specific point per actuation. Different applications, for example text capture on the one hand and games on the other, would be easier to use if the switching point of the key module was at another point in the actuating movement, i.e. the signal was triggered sooner or later. It would therefore be desirable to be able to adjust the switching point so that a key module and thus a keyboard can be optimally used for various applications.

Another disadvantage of mechanical key modules is that only one signal is triggered per actuation. A variable signal, in individual steps or in finely graduated steps or also steplessly, is therefore not possible. Many applications, for example in games, however, require a so-called joystick function, for example to be able to control objects at variable speeds.

The invention is therefore based on the object of specifying an apparatus and a method for detecting a key press, which apparatus or method, compared to the conventional mechanical key modules, allows a longer service life with substantially constant switching quality and/or expands the detection and processing options of the key press and thereby overcomes at least partially the aforementioned disadvantages. Furthermore, a new keyboard having such an apparatus is to be specified.

This object is achieved by an apparatus with the features of claim 1, a keyboard with the features of claim 14, and a method with the features of claim 16. Advantageous embodiments and developments are provided in each of the dependent claims.

The inventive apparatus for detecting a key press comprises a circuit substrate, a key module attached to the circuit substrate with a key cap and a movement mechanism for moving the key cap relative to the circuit substrate between a rest position and an actuation position, and a device for detecting the movement of the key cap relative to the circuit substrate. In particular, the key cap can be moved linearly and/or perpendicular to the circuit substrate.

A circuit substrate is understood to mean, for example, a printed circuit board and/or a circuit board and/or a circuit foil and/or a stamped part and/or some other substrate, in particular with applied and/or integrated conductor tracks. The circuit substrate can also be built up from two or more layers, for example from two or more of the aforementioned layers. Furthermore, a circuit substrate is also understood to mean any other reference device or reference component of the apparatus with respect to which the object moves.

The device for detecting the movement of the key cap relative to the circuit substrate in turn comprises an electrical resonance circuit with at least one capacitor and with at least one primary coil with one or more coil windings, which primary coil is stationary in relation to the circuit substrate, and at least one secondary coil with a short-circuited winding, which secondary coil is arranged in particular on or in the key cap or in relation to the key cap in a stationary manner and is moved with the key cap.

The primary coil is arranged on a rear side of the key module opposite the key cap on or in the circuit substrate. In particular, it can be a planar coil, other types of coils also being possible.

The secondary coil is a secondary coil element, in particular arranged on or in the key cap or in a stationary manner relative to the key cap, which comprises or consists of a conductive material, which material has a continuous recess (also: opening), so that the conductive material surrounding this recess is the short-circuited winding of the secondary coil. The secondary coil is thus a short-circuited secondary coil with a closed winding. Such a short-circuited secondary coil is understood to mean in particular any closed shape, for example a ring or a frame, of an electrically conductive material that has a continuous recess (also: opening) enclosed by the conductive material, so that a current flow is possible around this recess. In this case, no coil or winding ends can be defined, rather the short-circuited coil in this case consists of a closed winding.

The secondary coil element is expediently connected to the key cap in a stationary manner and is arranged between the key cap and the movement mechanism. But it is also possible that the secondary coil element is connected in a stationary manner to the key cap, but also forms a component, for example a frame element, of the movement mechanism, which for example establishes the connection between the movement mechanism and the key cap and/or allows for a movable bearing for movable components of the movement mechanism, for example, a rotary bearing and/or a rotary slide bearing and/or, as a resilient element, restricts or prevents a range of motion between the key cap and the movement mechanism.

For example, the key cap and thus also the secondary coil or the secondary coil element can thus be movable linearly and/or perpendicular to the circuit substrate and/or the primary coil, in particular designed as a planar coil.

According to the invention, it is further provided that the primary coil and the secondary coil are inductively coupled to one another. During the movement of the key cap and thus the secondary coil between the rest position and the actuation position, the strength of the inductive coupling between the primary coil and the secondary coil changes and thus at least one physical variable of the resonance circuit changes.

According to the invention, the device for detecting the movement of the key cap relative to the circuit substrate additionally comprises a measuring device for detecting and/or processing at least one physical variable of the electrical resonance circuit, which variable changes during the movement of the key cap and the secondary coil between the rest position and the actuation position. Furthermore, this device outputs at least one electrical signal that is dependent on the change in the physical variable, i.e. the measuring device has a corresponding apparatus for signal output.

The advantages of the apparatus according to the invention are in particular the contactless detection of the movement of the key cap and the output of an electrical signal caused by this. The mechanical solutions described at the outset and the associated problems do not apply. As a result, it is possible to manufacture apparatuses for detecting a key press on a keyboard and thus also keyboards with less susceptibility to interference and increased service life compared to corresponding apparatuses and keyboards with mechanical solutions. Furthermore, the contactless movement detection and subsequent output of the signal allows a qualitatively constant detection or switching process; there are no changes, for example, of the switching point or the switching reliability due to mechanical abrasion or wear or breakage.

Further advantages of the invention result from the expanded detection and processing options for the movement of the key cap. The inductive coupling changes continuously during the movement of the key cap. This applies accordingly to the physical variable detected by the measuring device, so that any switching points can be adjusted in a changeable manner and a variable signal that reflects the movement of the key cap and possibly also its speed, for example in individual steps or in finely graduated steps or also steplessly, can be output.

The inductive coupling of the primary and secondary coils takes place in particular in the manner of a transformer, with the secondary coil also being short-circuited.

The resonance circuit is preferably operated with alternating voltage, in particular alternating voltage with a predetermined and/or adjustable frequency, 16 MHz, for example, and is connected to a suitably equipped AC voltage source for this purpose. The capacitor can be a variable capacitor with adjustable capacitance. Furthermore, the resonance circuit, in particular for tuning, can additionally comprise at least one resistor, in particular an adjustable resistor.

The frequency and/or the capacitor is preferably set or selected in such a way that the resonance circuit is located in the resonance range (also: in the resonance zone) at a predetermined position of the key cap relative to the circuit substrate. The alternating voltage often supplies a plurality of resonance circuits of a plurality of apparatuses according to the invention which are assigned to the plurality of keys of a keyboard or form these, so that the frequency cannot be matched to the individual resonance circuit. In this case, the resonance circuit is adapted with regard to its resonance range by adjusting the capacitor capacitance or selecting a capacitor with a suitable capacitance. The resonance intensity or resonance bandwidth can be adjusted by adjusting or selecting the resistor or resistors.

The resonance circuit is an LC resonance circuit, and as a sub-case with resistance it is an LCR resonance circuit.

The physical variable can be an electrical voltage, an electrical current strength, or also a resonance frequency or the impedance of the primary coil. Among other things, all measurable parameters of a resonance circuit or LC/LCR circuit can be understood by this.

The inductive coupling between the primary and secondary coils can take place in primary and secondary coils without a metal core, for example an iron core. This is advantageous in the case of comparatively high-frequency operating voltages of the resonance circuit. However, it is also possible to provide a metal core in the primary and/or secondary coil, which proves to be particularly advantageous in the case of comparatively low-frequency operating voltages.

The apparatus can have exactly one secondary coil. However, it is also possible for two or three or more secondary coils to be arranged on or in the object. For example, these can differ with regard to their corresponding inductive coupling with the primary coil, for example due to a different number of windings. It is possible to individually interrupt the short circuit of the individual coils by providing appropriate switches and thus inductively couple only one or specific secondary coils to the primary coil (apart from a non-substantial additional coupling of the secondary coils with the switch open). In this way, different movements can be detected and differentiated, for example in a complex movement mechanism in which a plurality of components of a secondary coil are formed.

The mode of operation of the apparatus according to the invention is explained below:

The primary coil generates an alternating magnetic field in its environment, which field penetrates the secondary coil. As a result, the primary and secondary coils are inductively coupled via the alternating magnetic field. The alternating magnetic field emanating from the primary coil induces an electrical voltage in the secondary coil. Since the secondary coil is short-circuited, this results in a current flow within the secondary coil. In comparison to a secondary coil that is not short-circuited, this current flow is comparatively strong due to the short circuit and the associated low resistance of the secondary coil.

The current flow in the secondary coil in turn affects the primary coil and thus the resonance circuit (feedback). This feedback results in a change in physical variables of the resonance circuit, for example the impedance of the primary coil, the resonance frequency, the voltage drop, and/or the current flow. If, for example, the secondary coil is at a greater distance from the primary coil in a first position than in a second position, the inductive coupling in the first position is smaller than in the second position, since the magnetic field strength and the magnetic flux density decrease with increasing distance from the primary coil, and vice versa. In this example, the feedback to the primary coil and thus the change in the physical variables is correspondingly smaller in the first position than in the second position, and vice versa. This applies accordingly to intermediate positions between the first and second position. For example, the physical variables can also change continuously or steadily in the case of a continuous or steady movement between the first and second position. The first position can be, for example, the rest position of the key cap and the second position can be the actuation position of the key cap. Comparable effects result from a change in position or orientation of the secondary coil in the magnetic field of the primary coil, for example in the case of a tilting and/or rotating movement.

The changes in the resonance circuit due to the changing feedback result in an adjustment of the resonance circuit. If, for example, the resonance circuit is operated at its resonance frequency at a specific position of the secondary coil relative to the primary coil, the resonance frequency of the resonance circuit changes when the position of the secondary coil changes and the resonance dies away. This results in changes in physical variables such as voltage and current, which can be detected and further processed by means of the measuring device. The resonance circuit thus forms a type of inductive proximity switch, which signals an approach or distancing of the key cap to the circuit substrate.

On the basis of this detection of the change in one or more physical variables, various stepped and stepless signal processing operations can be implemented. The same applies vice versa: If the resonance circuit is not operated at its resonance frequency, the change in the distance or the position and/or alignment between the primary and secondary coil and the associated change in the inductive coupling and the resulting adjustment of the resonance circuit can cause the frequency with which the resonance circuit is operated to approach or reach its resonance frequency, with corresponding effects on physical variables such as voltage and current.

For example, a differential control can also be implemented: In this case, the starting position is between the first and second position, the resonance circuit in the assumed position preferably being operated in the region of a resonance flank and being calibrated as the zero position of the detected physical variable or variables. A movement of the key cap in the direction of the first position can then be assessed as a negative movement of the key cap and a movement of the key cap in the direction of the second position can be assessed as a positive movement of the key cap, based on the detected change in the physical variable or variables during the signal output, or vice versa.

A further development of the invention provides that the secondary coil element forms a flat surface in which the continuous recess is located. In the rest position of the key cap and/or in the actuation position of the key cap and/or during the movement of the key cap between rest position and actuation position, the flat surface is aligned parallel to the circuit substrate and/or to the primary coil, in particular designed as a planar coil. In this context, "flat" is understood to mean any largely flat alignment, i.e. in particular manufacturing tolerances are also comprised, furthermore a small angle at a kink in the plane at which the inclination of the plane changes slightly, for example an angle less than 10°. In this context, "parallel" is understood to mean any largely parallel alignment, i.e. in particular manufacturing tolerances are also comprised, as well as small angular deviations, for example by angles less than 10°. The planar coil forms, for example, a flat surface on the circuit substrate. In this case, the flat surface of the secondary coil element is aligned parallel to this flat surface of the planar coil, which is advantageous for the inductive coupling between the primary coil and the secondary coil. The flat surface can be a surface of a secondary coil element embodied as a stamped metal part and/or a bent metal part.

The secondary coil element can be a stamped and/or bent part made from sheet metal. In particular, it can be a stamped and/or bent part with at least one frame-like and/or ring-like portion surrounding the continuous recess. If necessary, further portions, in particular on an outer edge of the aforementioned portion, can be provided, for example obliquely or perpendicularly protruding portions for connection to elements of the movement mechanism.

According to a development, the secondary coil element is a resilient element which is designed and arranged between the key cap and the movement mechanism in such a way that mechanical play between the key cap and the movement mechanism is prevented. Mechanical play is understood to mean, in particular, a freedom of movement between the key cap and the movement mechanism, which can result in undesirable noises.

To form the secondary coil element as a resilient element, the secondary coil element can form a groove and/or a kink that divides the secondary coil element into two wings that are resiliently movable relative to one another at the groove and/or kink. The two wings can be mounted on two outer, opposite edges in the key module or on the movement mechanism in such a way that, in the rest position of the key cap and/or in the actuation position of the key cap and/or during the movement of the key cap between rest position and actuation position, the secondary coil element is in contact with both the key cap and the movement mechanism and clamps them resiliently to one another, so that there is no freedom of movement between the key cap and the movement mechanism.

If the key cap has a movement mechanism and/or further components, it is advantageous if the components of the movement mechanism and/or the further components and/or the key cap itself do not have any electrically closed ring-like or frame-like elements with an internal continuous recess or opening made of a conductive material such as metal, provided that these are not intended to form a secondary coil within the meaning of the invention. These elements could also couple inductively to the primary coil and interfere with the inductive coupling between the primary and secondary coil. To avoid this, it is sufficient to electrically interrupt the ring or frame at least at one point in the corresponding elements. Then, no current flow is possible in these elements and there is accordingly no or at least no relevant inductive coupling to the primary coil. This state corresponds to a transformer in idle mode.

Against this background, one embodiment of the invention provides that all components of the movement mechanism that are movable relative to the circuit substrate, but not the secondary coil element, are designed in such a way that no conductive material encloses a continuous recess and/or that no closed current flow can occur around a continuous recess and/or that a ring or frame made of conductive material has a circumferential interruption around a continuous recess. The circumferential interruption is thus designed in such a way that it prevents or makes impossible a current flow around the continuous recess.

The movement mechanism can be a parallel mechanism, in particular a double-wing parallel mechanism and/or a scissors-parallel mechanism.

A parallel mechanism is understood to mean a mechanism with which the key cap can be raised and lowered linearly relative to the circuit substrate, i.e. along a straight line, without changing its orientation. In particular, the key cap is neither twisted nor tilted during this linear movement. A plane of extension laid through the key cap shifts when the movement is carried out with the parallel mechanism in such a way that the resulting plane of extension after the movement runs parallel to the original plane of extension before the movement.

According to one embodiment of the invention, it is provided that the movement mechanism is soldered to the circuit substrate. In particular, a base of the parallel mechanism, on which further components of the movement mechanism are mounted, for example by means of rotary bearings and/or rotary slide bearings, is soldered to the circuit substrate. In other configurations, another attachment is also possible, for example by means of gluing or clamping.

A further development of the invention provides that a light source for illuminating the key cap is arranged on the circuit substrate in a region surrounded by the windings of the primary coil, in particular designed as a planar coil. The light source can be, for example, an LED or a light guide. Furthermore, the light source can be dimmable steplessly or in steps.

The key module can be designed in such a way that light reaches the key cap from the rear side of the movement mechanism through the movement mechanism and through the continuous recess in the secondary coil element. In this way, for example, a rear side of the key cap can be illuminated. Symbols made of light-permeable material, which extends through the key cap from its front side to its rear side, are illuminated from the rear side and thus light up on the front side and are therefore also visible in the dark. Lighting around the key cap is also possible.

A base of the key module and/or movement mechanism can at least partially consist of light-permeable material. Material emanating from the light source is then passed on through the at least partially light-permeable base and optionally also distributed in a targeted manner in order to achieve lighting effects on the key cap or around the key cap.

A further development of the invention provides that a base of the movement mechanism attached to the circuit substrate and/or a frame element attached to the circuit substrate is designed to protect the movement mechanism and/or a region of the circuit substrate opposite the rear of the key module and/or one or more light sources and/or electronic components and/or mechanical components and/or connecting devices, for example soldering points, arranged in a region of the circuit substrate opposite the rear side of the key module from environmental influences. If necessary, additional sealing means can be provided for this purpose.

The base of the movement mechanism can be used to movably mount further components of the movement mechanism, in particular by means of rotary bearings and/or rotary slide bearings.

The aforementioned frame element can be a frame surrounding the key cap at least in its actuation position, in particular a decorative frame.

The primary coil, in particular designed as a planar coil, can be arranged on an upper side and/or an underside of the circuit substrate and/or between at least two layers within a multilayer circuit substrate. The upper side is preferably the side or surface of the circuit substrate to which the key module is also attached or which faces the key module. The underside is correspondingly that side or surface which faces away from the key module. The primary coil, in particular designed as a planar coil, can also be arranged between at least two layers within a multilayer circuit substrate.

A winding of the primary coil is understood to mean, in particular, a complete winding. In particular, the winding has at least largely a circular or oval shape or also an angular shape, for example a rectangular shape, for example with rounded corners. In case of the planar coil, the plurality of windings that may be present preferably lie in one plane, i.e. the coil wire lies in one plane and the windings thus have different dimensions in this plane and are arranged one inside the other in this plane. Correspondingly, the planar coil optionally comprising numerous windings can also have a circular or ring shape or an oval shape or an angular shape, for example a rectangular shape, optionally with rounded corners. A plurality of windings of a planar coil can also run into one another in a spiral shape.

The planar coil can be arranged as a printed circuit on the upper side and/or underside of the circuit substrate or also within the circuit substrate. Furthermore, the planar coil can be implemented as a metallized film or as a stamped metal plate (stamped part).

According to a development of the invention, the measuring device is set up such that when at least one change limit value of the physical variable is reached or exceeded, the at least one electrical signal is output and/or that the signal strength of the at least one electrical signal changes as a function of the change in the physical variable.

The change limit value can be a common change limit value that functions both for a first movement from the rest position to the actuation position and for a second movement from the actuation position back into the rest position. However, it is also possible to specify two or more different change limit values, for example a first change limit value that works with the aforementioned first movement and a second change limit value that works with the aforementioned second movement.

The change limit values mentioned can be fixed. However, it is also possible for the change limit value or the change limit values to be adjustable. This has the advantage that the so-called switching point, i.e. the exact position of the key cap during the corresponding movement during which the at least one electrical signal is output, can be changed and thus adjusted without mechanical changes to the key module. Thus, the operator of the keyboard can individually adjust the desired switching point of the keys on his keyboard without—as before—having to buy new key modules. For example, the same keyboard can be used for gaming and office applications, only the switching point has to be changed, if desired. A manufacturer can also provide a uniform keyboard model for different applications and preset the switching point differently for the corresponding application.

The measuring device can be set up in such a way that the signal strength of the at least one electrical signal is dependent on the position of the key cap relative to the circuit substrate and thus on the distance between the primary coil and the secondary coil. For example, a variable signal can be output in individual steps or in finely graduated steps or also steplessly. This is possible, for example, if the key cap is moved in such a way that the physical variable or variables of the resonance circuit change constantly during the movement, in particular continuously and/or steplessly. The measuring device can then be set up in such a way that the at least one electrical signal is output continuously or finely graduated or in individual steps during the movement of the key cap, preferably with a change in the signal strength which is correspondingly stepless or finely graduated or which is carried out in individual steps.

In this way, a so-called joystick function can be implemented for keys, at least for one or individual or all keys on a keyboard, which opens up a wide range of new application possibilities in particular in the gaming sector, but also in office applications and other applications, for example when scrolling through documents, tables, and websites at variable speeds or when controlling objects at variable speeds.

The aforementioned options for adjusting the switching points of the individual key modules and thus keys and/or implementing a joystick function also have the advantage that keyboards can be recalibrated over time. Mechanical, electromechanical, and electronic components can wear out and/or change their properties due to aging. In the case of key modules and keyboards, for example, this can result in the switching points and/or the assignment of movement positions of the damping element to output signals or signal strengths changing; if necessary, specific functions can even be omitted entirely due to adjustment effects. In the aforementioned measuring device, an assignment of the detected physical variable or variables to the strength of the electrical signal output or a definition of one or more change limit values can be provided. This assignment can be adapted if necessary, for example due to the aforementioned wear and aging effects. In this way, for example, each individual key module and/or the entire keyboard can be recalibrated, i.e. the initial state is at least largely restored. For example, this can be done each time the keyboard is switched on and/or by entering specific commands and/or by using specific key combinations. In this way, for example, the aging of components over the course of their service life can be compensated for. In an analogous manner, manufacturing tolerances or tolerance-related differences in the key modules and/or keyboards can be compensated for by appropriate calibration or adjusting.

The keyboard according to the invention comprises one or more, preferably a plurality of apparatuses according to the invention. The advantages of this keyboard over conventional keyboards emerge from the explanations given above and below on the apparatus according to the invention.

The circuit substrate of the apparatus is arranged in particular in a frame or housing of the keyboard. A key module and a primary coil are arranged in or on the circuit substrate, wherein the primary coil can be arranged in a plurality of alternative embodiments, for example on an upper side of the circuit substrate on which the key module is also arranged or which faces the key module, or on an underside opposite the upper side or—in the case of a multilayer structure of the circuit substrate—within the circuit substrate. In addition to the primary coil and the capacitor already mentioned, further, in particular electrical or electronic components can be provided in and/or on the circuit substrate.

The keyboard can have an underside and an upper side opposite the underside, the underside and/or the upper side being formed from metal or having a metallic layer or a metallic additional layer or a metallic insert. As a result, external interference on the impedance of the primary coils and/or the resonance circuits inside the keyboard, for example based on cell phone radiation or metallic objects, in particular in the vicinity of the keyboard, can be shielded.

The method according to the invention relates to an operating method for the apparatus according to the invention and/or the keyboard according to the invention. The method according to the invention is a method for detecting a key press with an apparatus according to the invention and/or or a keyboard according to the invention. This method comprises the steps of:
  a) carrying out an actuating movement of the key cap in such a way that the inductive coupling between the primary coil and the secondary coil and thus also at least one physical variable of the resonance circuit changes;
  b) detecting and/or processing the at least one physical variable of the resonance circuit by means of the measuring device, which variable changes due to the movement;
  c) outputting at least one electrical signal when a change limit value of the physical variable is reached or exceeded and/or the signal strength of the at least one electrical signal changes as a function of the change in the physical variable.

The advantages of the method and further method steps emerge from the above description of the apparatus according to the invention.

In particular, a value of at least one physical variable of the resonance circuit is measured during the entire actuating movement of the key cap. This can be, for example, an electrical voltage and/or an electrical current strength and/or a resonance frequency. Among other things, all measurable parameters of a resonance circuit can be understood by this. However, other known electrical variables can also be measured.

According to one variant, it can be provided that the electrical signal is triggered when the measured variable reaches or exceeds a change limit value (also: threshold value). This can be the case at any time during the movement of the key cap or at the end points of the movement. One or more change limit values can preferably be predetermined. Further preferably, one or more change limit values are adjustable, as already explained above with reference to the apparatus according to the invention.

According to an alternative or additional variant, it can also be provided to change the signal strength of the at least one electrical signal as a function of the change in the physical variable or variables and thus, for example, to implement the joystick function already mentioned.

According to one embodiment, the resonance circuit is operated with an alternating voltage of a predetermined and/or adjustable frequency and is adjusted in such a way by adjusting or selecting the frequency and/or by adjusting or selecting the capacitance of the capacitor and/or by adjusting or selecting a resistor arranged in the resonance circuit, that the resonance circuit is located in the resonance range at a predetermined position of the key cap relative to the circuit substrate.

A further development provides that the key cap and/or the secondary coil element is moved linearly and/or perpendicular to the circuit substrate and/or to the primary coil, in particular designed as a planar coil, during the actuating movement.

It can also be provided that a distance between the secondary coil element and the circuit substrate and/or the primary coil changes during the actuating movement.

Figure 2:
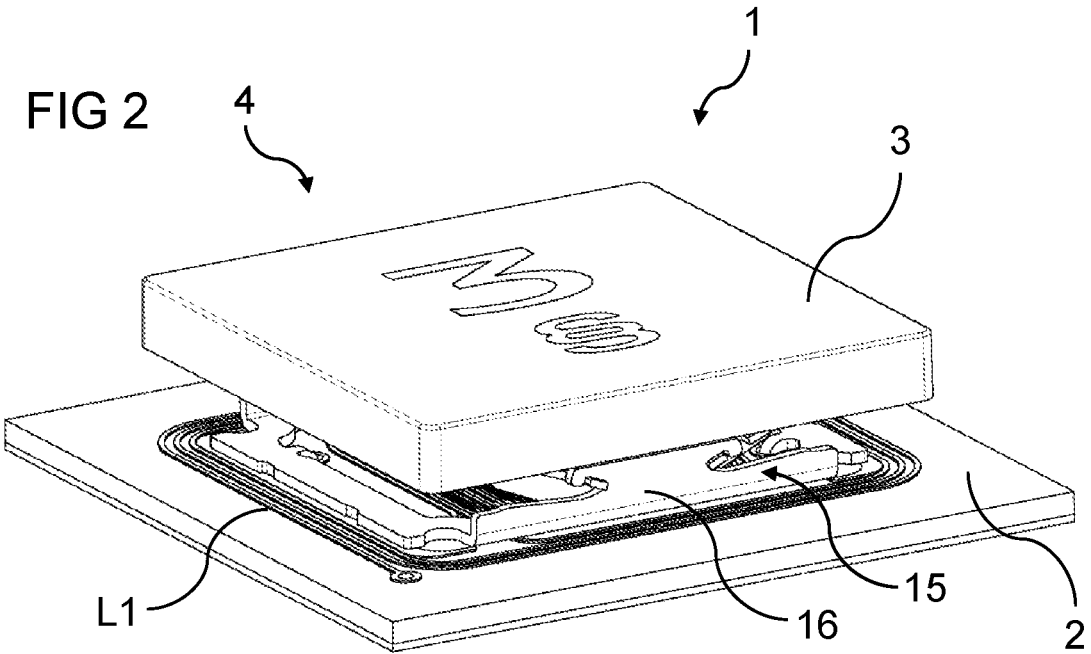
Figure 3:
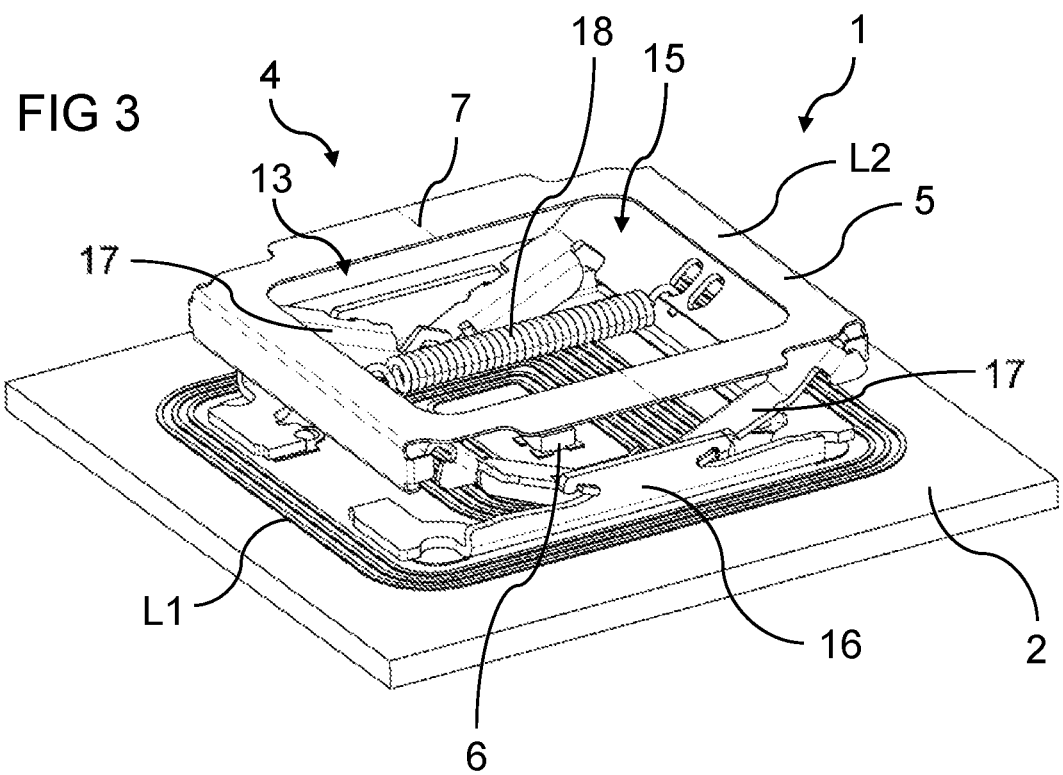
Figure 4:
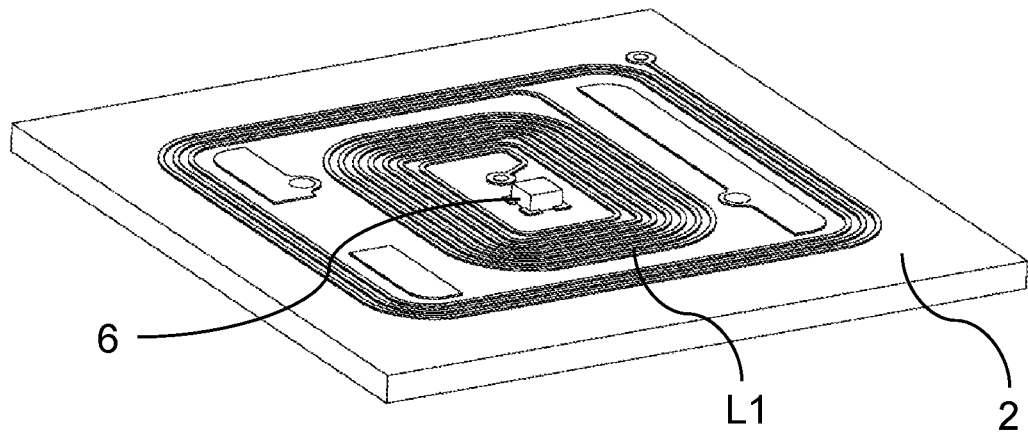
Figure 5:
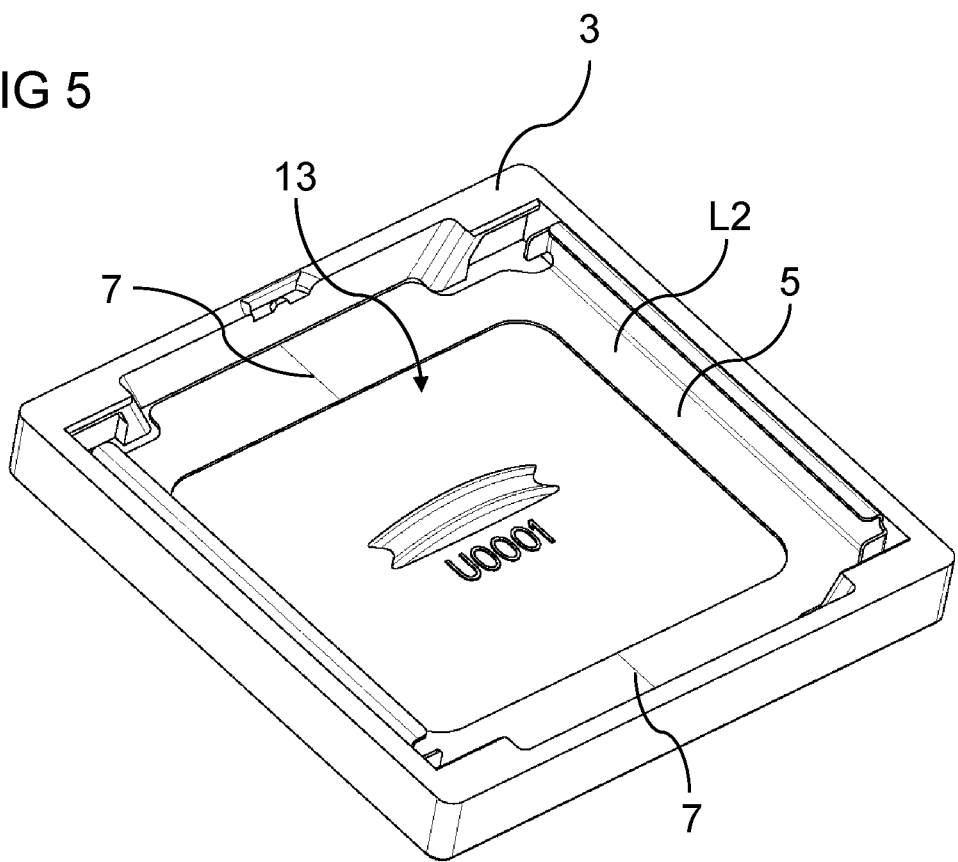
Figure 9:
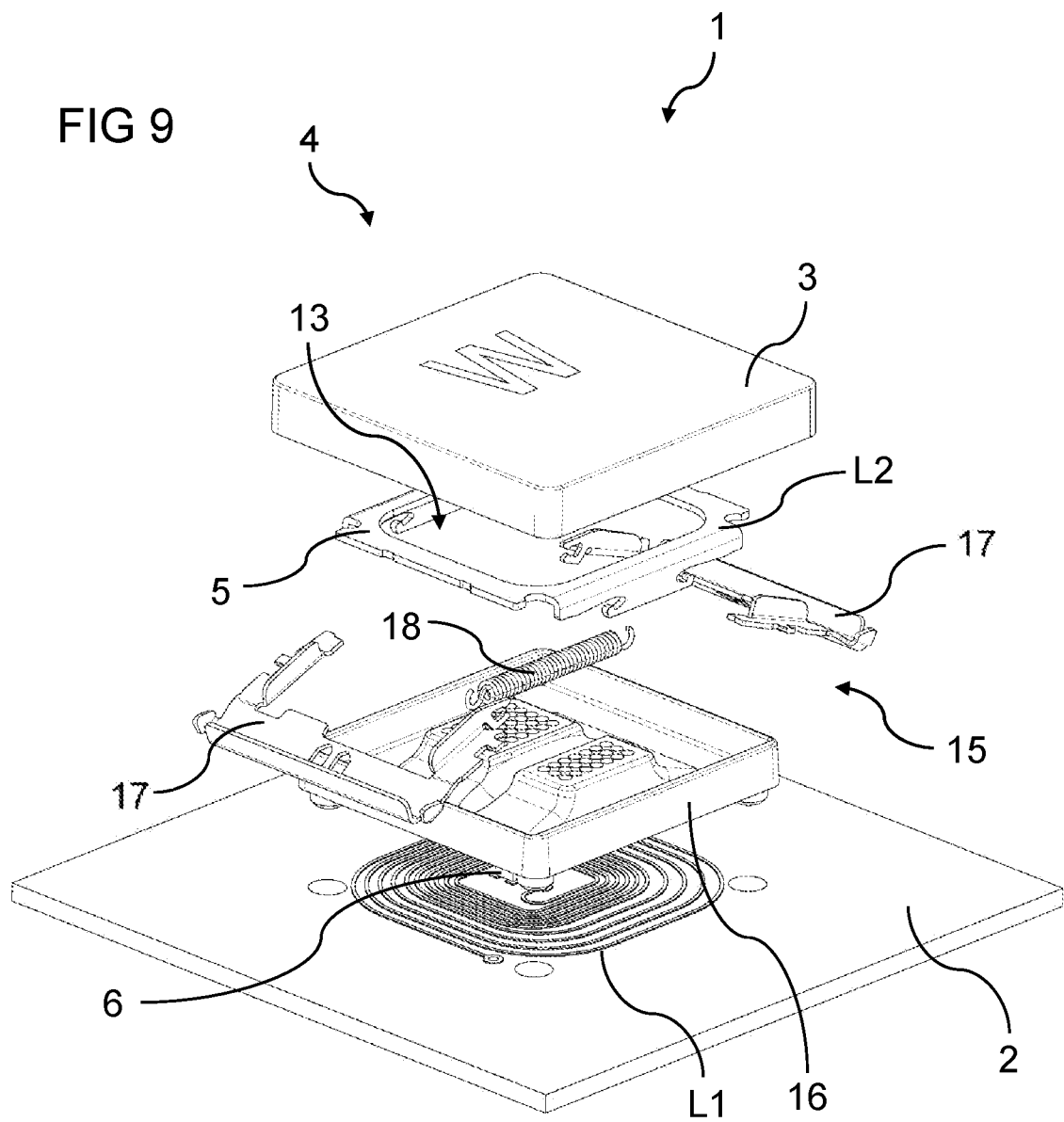
Figure 10:
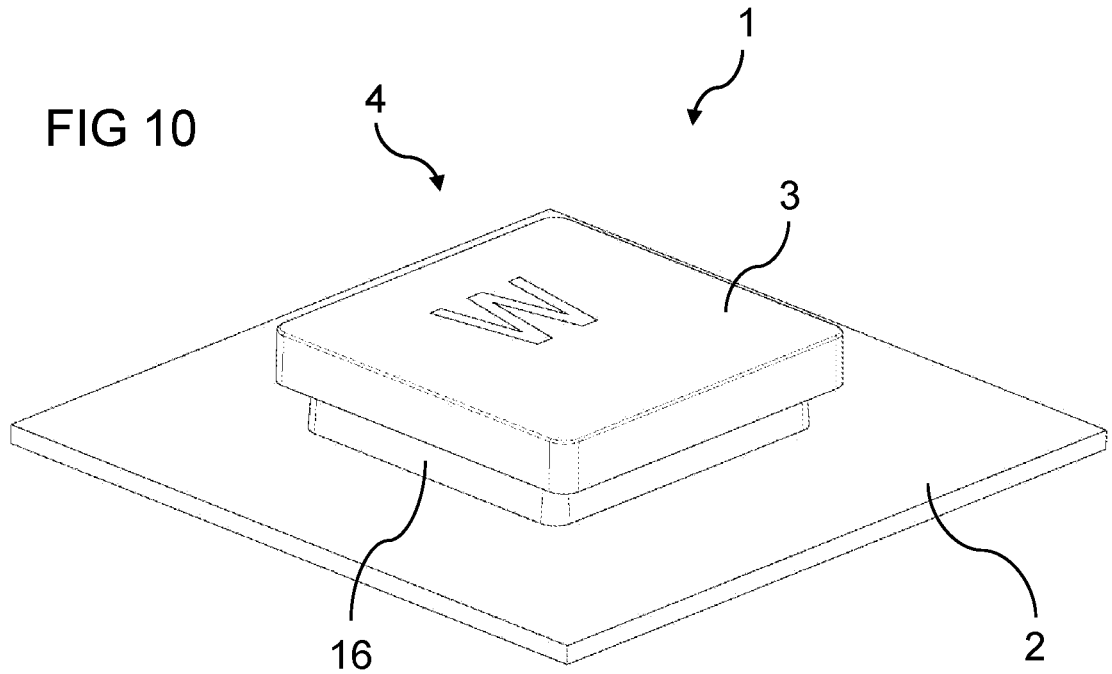
Figure 11:
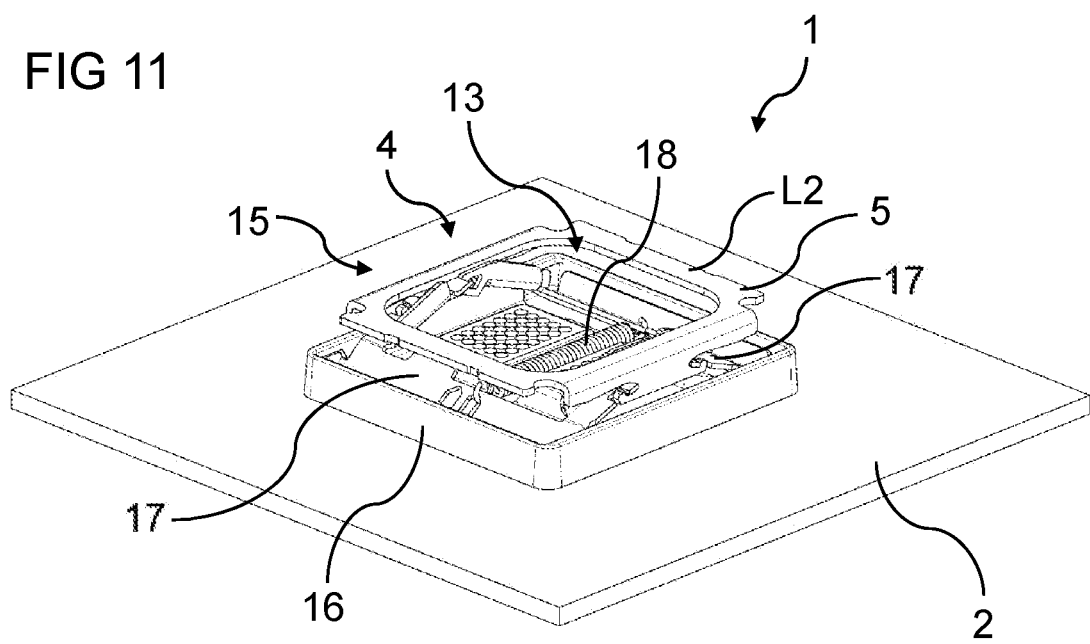
Figure 12:
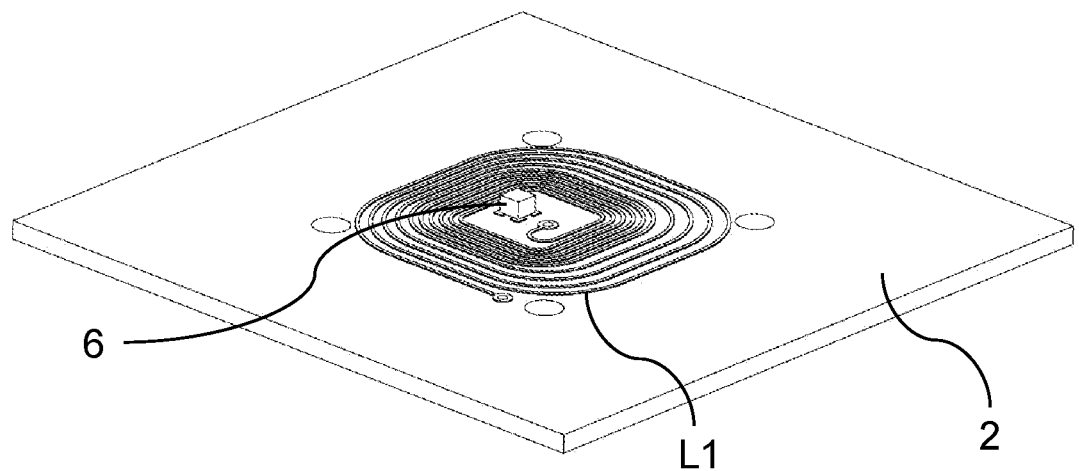
Figure 13:
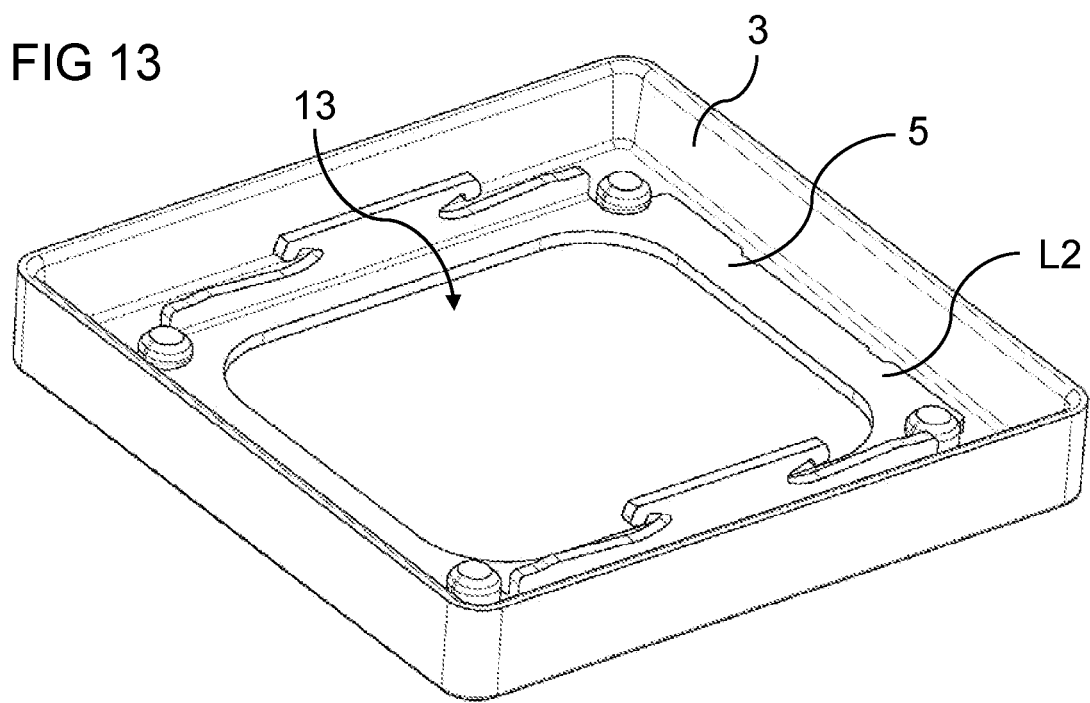
Figure 16:
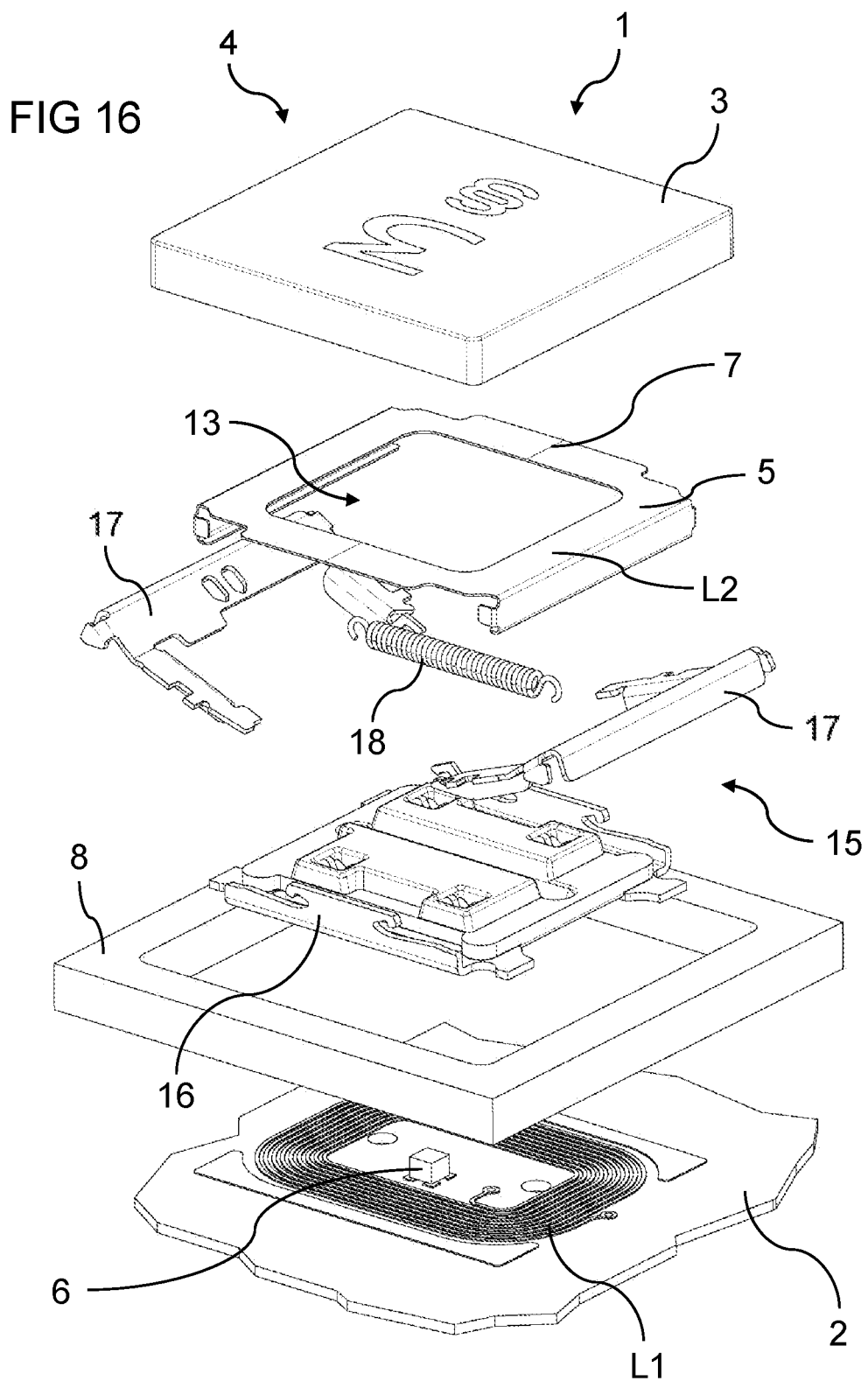
Figure 17:
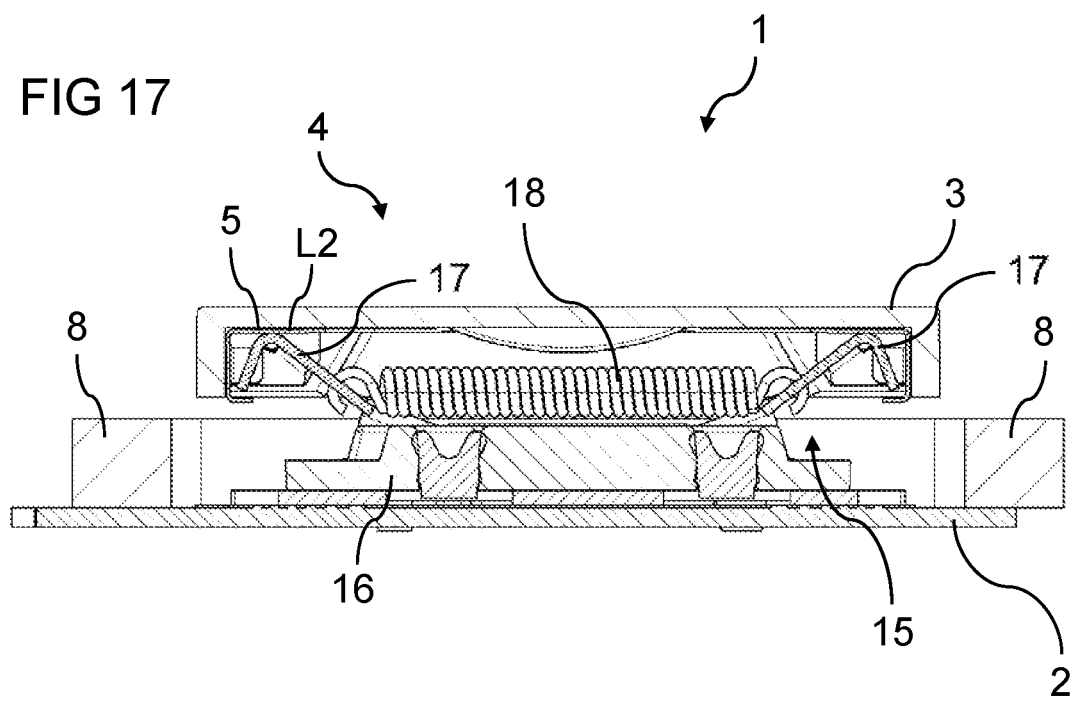
Figure 18:
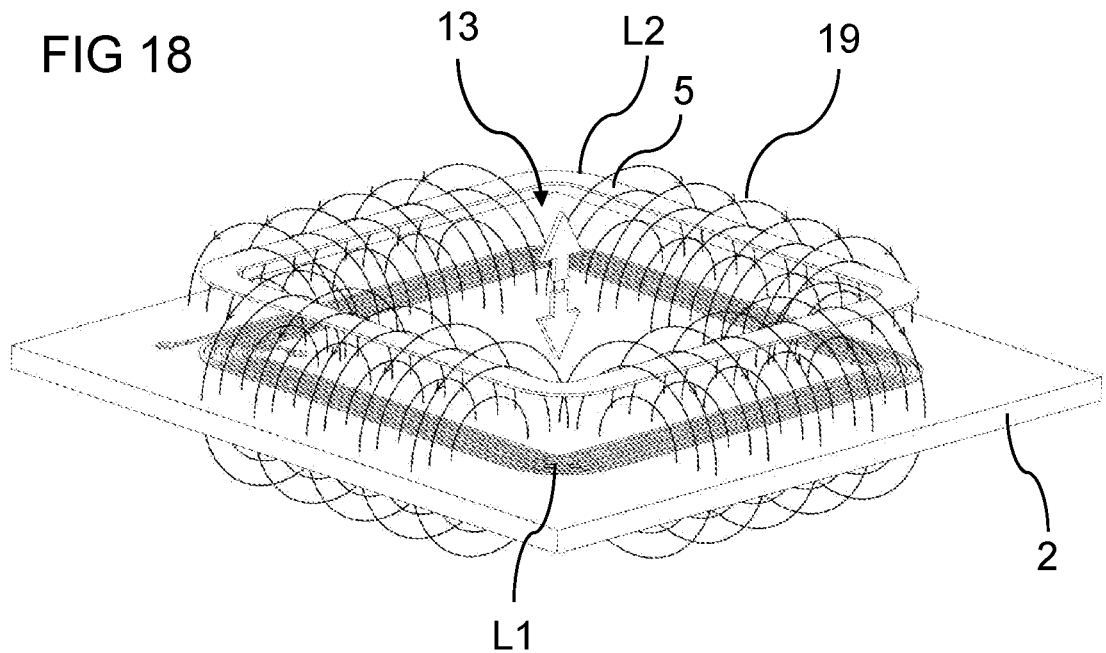
Figure 19:
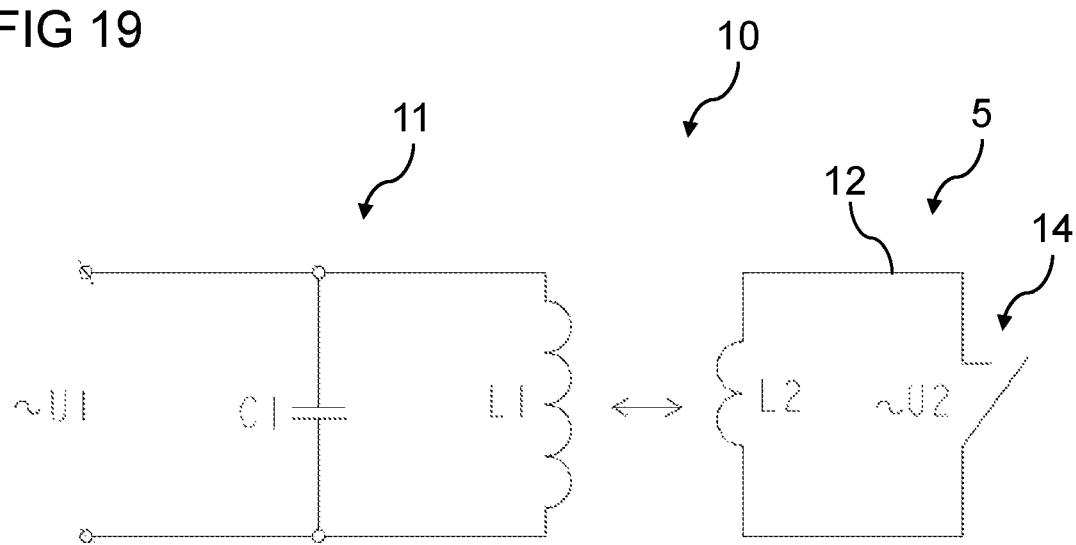

The invention is explained in more detail below also with regard to further features and advantages on the basis of the description of embodiments and with reference to the accompanying schematic drawings, in which:

FIG. 1 shows a first embodiment of an apparatus according to the invention in an exploded view, FIG. 2 shows a variant of the first embodiment in a rest position, FIG. 3 shows the embodiment of FIG. 2 with the key cap removed and rotated by about 180°, FIG. 4 shows the embodiment according to FIG. 3 without a movement mechanism, FIG. 5 is a view of the rear side of the key cap of the first embodiment with attached secondary coil element, FIG. 6 is a cross section through the first embodiment without a circuit substrate, at the top in a rest position and at the bottom in an actuation position, FIG. 7 is a cross section running perpendicular to the cross section according to FIG. 6 through an edge region of the first embodiment in a rest position, FIG. 8 is a cross section running parallel to the cross section according to FIG. 6 at another position, near an edge region, through the first embodiment with a circuit substrate but without a key cap, at the top in a rest position and at the bottom in an actuation position, FIG. 9 shows a second embodiment of an apparatus according to the invention in an exploded view, FIG. 10 shows the second embodiment in a rest position, FIG. 11 shows the embodiment according to FIG. 10 with removed key cap, FIG. 12 shows the embodiment according to FIG. 11 without movement mechanism, FIG. 13 is a view of the rear side of the key cap of the second embodiment with attached secondary coil element, FIG. 14 is a cross section through the second embodiment with the circuit substrate, at the top in a rest position and at the bottom in an actuation position, FIG. 15 is a cross section running perpendicular to the cross section according to FIG. 14 through the second embodiment in a rest position, FIG. 16 is a third embodiment of an apparatus according to the invention in an exploded view, FIG. 17 is a cross section through the third embodiment with the circuit substrate in a rest position, FIG. 18 is a representation to explain the principle of operation on which the invention is based, and FIG. 19 is the exemplary representation of a device for detecting a movement of the key cap of an embodiment of the apparatus according to the invention as a circuit diagram.

Parts and components that correspond to one another are provided with the same reference signs in all figures, also across different embodiments.

FIGS. 1 to 8 show a first embodiment, FIGS. 9 to 15 show a second embodiment, and FIGS. 16 and 17 show a third embodiment of an apparatus 1 according to the invention for detecting a key press on a keyboard. The various embodiments differ in particular with regard to the movement mechanism used and any additional elements used.

In all of the embodiments, the apparatus 1 is provided for use in a keyboard or specifically in connection with a key on the keyboard. The apparatus 1 comprises in each case a circuit substrate 2, a key module 4 attached to the circuit substrate 2 with a key cap 3, and a movement mechanism 15 for moving the key cap 3 relative to the circuit substrate 2, specifically perpendicular to the circuit substrate 2, between a rest position and an actuation position, and a device 10 for detecting the movement of the key cap 3 relative to the circuit substrate 2.

In all embodiments, the apparatus 1 also comprises a primary coil L1 designed as a planar coil with a plurality of windings, which primary coil is arranged in a stationary manner in relation to the circuit substrate 2 on an upper side of the circuit substrate 2, namely on a rear side of the key module 4 opposite the key cap 3. A light source 6, specifically an LED, is attached to the circuit substrate 2 in the center of the primary coil L1.

In all embodiments, the apparatus 1 comprises a secondary coil L2 arranged on a rear side of the key cap 3 and moved with the key cap 3. The secondary coil L2 is in each case a secondary coil element 5 arranged on the rear side of the key cap 3 within a surrounding frame of the key cap 3, specifically a stamped and bent part made of sheet metal that has a continuous recess 13. The metal surrounding this recess 13 in a frame-like or ring-like manner forms a short-circuited winding of the secondary coil L2. The secondary coil L2 thus has exactly one winding and is short-circuited; an induced electrical current can flow around the recess 13. Light from the light source 6 can reach the key cap 3 through the recess 13 and backlight it.

In all embodiments, the primary coil L1 and the secondary coil L2 are inductively coupled to one another. This inductive coupling is also shown schematically in FIG. 18. The primary coil L1—also in FIG. 18 a planar coil with a plurality of windings on the upper side of a circuit substrate 2—is part of a resonance circuit 11, which is explained below with reference to FIG. 19 and is operated with an alternating voltage U1. As a result, the windings of the primary coil L1 are surrounded by the magnetic field 19 shown in FIG. 18. The secondary coil L2 is located in this magnetic field 19; also in FIG. 18 a secondary coil element 5, specifically a ring-like or frame-like closed stamped part, with a continuous recess 13, i.e. the secondary coil L2 is short-circuited and has only one winding.

Due to the alternating voltage U1, the magnetic field 19 is an alternating magnetic field which, due to the inductive coupling, causes a voltage and thus, due to the short circuit, a current flow in the secondary coil L2, which in turn feeds back to the primary coil L1. If the secondary coil L2 is now moved relative to the primary coil L1, which is indicated in FIG. 18 by the double arrow in the middle, this affects the strength of the inductive coupling, and physical variables change, for example voltage and current strength, and resonance frequency of the resonant circuit 11, to which resonance circuit the primary coil L1 belongs.

A measuring device (not shown in the figures) detects and processes at least one of the physical variables of the electrical resonance circuit 11, which variables change during the movement of the secondary coil L2, which movement is based on the movement of the key cap 3, and outputs at least one electrical signal that is dependent on the change in this physical variable. The strength of the inductive coupling between the primary coil L1 and the secondary coil L2 and thus at least one physical variable of the resonance circuit 11 thus change during the movement of the key cap 3 with the attached secondary coil L2 between the rest position and the actuation position.

The apparatus 1 thus comprises a device 10 (not shown in FIGS. 1 to 18) for detecting a movement of the key cap 3 relative to the circuit substrate 2. This device 10 is shown as a circuit diagram in FIG. 19. This device 10 comprises the already mentioned electrical resonance circuit 11 with a capacitor C1 and the primary coil L1, it being possible to additionally provide a resistor (not shown). The resonance circuit 11 is operated with an alternating voltage U1. Of this resonance circuit 11, only the primary coil L1 is shown in FIG. 1.

As can also be seen in FIG. 19, the aforementioned device 10 further comprises a secondary coil L2, the ends of which are electrically short-circuited via a short-circuit line 12. This symbolizes the closed secondary coil element 5 of the embodiments according to FIGS. 1 to 18. In the short-circuit line 12, a switch 14 is provided with which the short-circuit line 12 can be interrupted and closed again. This is an embodiment variant that can be implemented by an interruption in one winding of the secondary coil element 5 that can be bridged electrically by a switch 14. If the switch 14 is omitted in FIG. 19, the circuit diagram shows the resonance circuit 11 with a secondary coil element 5 without interruption in handling, as is shown in FIG. 1 to FIG. 18.

The inductive coupling of the primary coil L1 and the secondary coil L2 is shown symbolically in FIG. 19 by a double arrow between the two coils L1, L2. The alternating magnetic field generated by the alternating voltage U1 induces an alternating voltage U2 in the secondary coil which, when the switch 14 is closed, due to the short circuit, results in a current flow in the secondary coil L2, which results in a feedback to the primary coil L1 and thus to the resonance circuit 11, whereby—as already explained—its physical variables change, which in turn is detected by the measuring device also already explained and results in a corresponding signal output.

In all embodiments, the movement mechanism 15 is a double wing mechanism comprising two wing elements 17 and a spring 18 connecting the two wing elements 17. Any other desired movement mechanisms 15 can also be provided, for example a scissors mechanism.

In the first embodiment according to FIGS. 1 to 8, the movement mechanism 15 further comprises a base 16. The primary coil L1 is attached to the upper side of the circuit substrate 2 in the region in which the base 16 of the movement mechanism 15 is also provided. In the assembled state, the base 16 virtually surrounds the primary coil L1 designed as a planar coil. FIG. 1 on the one hand and FIG. 2 to FIG. 4 on the other hand show two variants of the first embodiment which differ in the specific design of the primary coil L1. In FIG. 1, the primary coil designed as a planar coil forms a closed region, whereas in FIG. 2 to FIG. 4, it forms two separate regions, wherein attachment points such as solder contact points and a recess for the precise positioning of the base 16 via pins corresponding to these recesses in an intermediate region between these regions are arranged on the base 16.

The movement mechanism 15 may be attached to the circuit substrate 2 by soldering. However, another attachment is also possible, for example by means of gluing or clamping, as shown in FIGS. 9, 10, and 11. For the exact positioning, so-called pins on the corresponding components of the movement mechanism 15, which components engage in corresponding recesses in the circuit substrate 2.

In the embodiment according to FIG. 1 to FIG. 8, the two wing elements 17 are movably supported both on the base 16 and on the key cap 3. The secondary coil element 5 has a kink 7 which divides the secondary coil element 5 into two parts that can be resiliently tilted against one another and thus forms a resilient element that clamps the key cap 3 and the wing elements 17 and thus prevents freedom of movement between the key cap and the wing elements.

In the embodiment according to FIG. 1 and FIG. 8, all components of the movement mechanism 15, in particular the base 16 and the wing elements 17, are provided with circumferential interruptions, i.e. an induced ring current flow and thus an effect impairing the inductive coupling between primary coil L1 and secondary coil L2 is not possible.

In the second embodiment according to FIG. 9 to FIG. 15, a base 16 is provided in the region of the secondary coil element 5 in which the primary coil L1 is also arranged. In the assembled state, the base 16 surrounds the primary coil L1, which is designed as a planar coil, and the light source 6 and thereby protects them from environmental influences. The movement mechanism 15 is also protected from environmental influences by the base 16. The base 16 is made of light-permeable plastics material and thus of non-electrically conductive material, so that a ring-like or frame-like design without interruption on the circumference is not a problem, since non-electrically conductive plastics material does not or does not significantly influence the inductive coupling between the primary coil L1 and the secondary coil L2. The light-permeable plastics material conducts and distributes the light emanating from the light source 6 in the desired manner.

In the embodiment according to FIG. 9 to FIG. 15, the two wing elements 17 are movably mounted both on the base 16 and on the secondary coil element 5, which in turn is attached to the key cap 3. In this case, the secondary coil element 5 is designed without a kink, since the wing elements 17 are not attached directly to the key cap 3 and thus no freedom of movement between these elements can be prevented. FIG. 13 shows how, in this case, the secondary coil element 5 is firmly attached to the rear side of the key cap 3 and forms attachment points for the movable attachment of the wing elements 17.

The third embodiment according to FIGS. 16 and 17 is comparable to the first embodiment according to FIGS. 1 to 8. In this case, the base 16 additionally has a light-permeable portion that covers the light source and is made of a non-electrically conductive plastics material. Furthermore, a frame element 8 is provided on the circuit substrate 2, which surrounds the primary coil L1 and the light source 6 and possibly other electronic components (not shown) and thus protects the components and also the movement mechanism 15 from environmental influences. FIG. 17 shows that this frame element 8 is dimensioned in such a way that it surrounds the key cap 3 during a movement from the illustrated resting state into the actuated state (not shown). The frame element 8 thus simultaneously represents a visible frame for the key cap 3.

In the embodiment according to FIG. 16 and FIG. 17, all components of the movement mechanism 15, in particular the base 16, the two metallic parts of which are connected to the bearings for the wing elements 17 only via a light-permeable portion made of non-electrically conductive, translucent plastics material, and the wing elements 17, are provided with circumferential interruptions, i.e. an induced ring current flow, and thus an effect impairing the inductive coupling between primary coil L1 and secondary coil L2 is not possible.

LIST OF REFERENCE SIGNS

1 Apparatus
2 Circuit substrate, for example printed circuit board
3 Key cap
4 Key module
5 Secondary coil element
6 Light source
7 Kink
8 Frame element
10 Device for detecting a movement of the key cap 3
11 Resonance circuit
12 Short-circuit line of the secondary coil L2
13 Recess
14 Switch
15 Movement mechanism
16 Base
17 Wing element
18 Spring
19 Magnetic field
C1 Capacitor
L1 Primary coil
L2 Secondary coil
U1 Alternating voltage
U2 Induced alternating voltage of the secondary coil L2

The invention claimed is:

1. Apparatus (1) for detecting a key press comprising a circuit substrate (2), a key module (4) attached to the circuit substrate (2) with a key cap (3), and a movement mechanism (15) for moving the key cap (3) relative to the circuit substrate (2) between a rest position and an actuation position, and a device (10) for detecting the movement of the key cap (3) relative to the circuit substrate (2), wherein this device (10) comprises an electrical resonance circuit (11) with at least one capacitor (C1) and with at least one primary coil (L1) stationary in relation to the circuit substrate (2) with one or more coil windings and comprises at least one secondary coil (L2) with a short-circuited winding, which secondary coil is moved with the key cap (3), wherein the primary coil (L1) is arranged on a rear side of the key module (4) opposite the key cap (3) on or in the circuit substrate (2), wherein the secondary coil (L2) is a secondary coil element (5) which comprises or consists of a conductive material, which material has a continuous recess (13), so that the conductive material surrounding this recess (13) is the short-circuited winding of the secondary coil (L2), wherein the primary coil (L1) and the secondary coil (L2) are inductively coupled to one another, and the strength of the inductive coupling between the primary coil (L1) and the secondary coil (L2) and thus at least one physical variable of the resonance circuit (11) change during the movement of the key cap (3) and thus the secondary coil (L2) between rest position and actuation position, wherein the device (10) for detecting the movement of the key cap (3) relative to the circuit substrate (2) comprises a measuring device for detecting and/or processing at least one physical variable of the electrical resonance circuit (11), which variable changes during the movement of the key cap (3) and the secondary coil (L2) between the rest position and the actuation position, and outputs at least one electrical signal dependent on the change in the physical variable.

2. Apparatus (1) according to claim 1,
characterized in
that the secondary coil element (5) forms a flat surface in which the continuous recess (13) is located, and
in that the flat surface in the rest position of the key cap (3) and/or in the actuation position of the key cap (3) and/or during the movement of the key cap (3) between rest position and actuation position is aligned parallel to the circuit substrate (2) and/or to the primary coil.

3. Apparatus (1) according to claim 1,
characterized in that
that the secondary coil element (5) is a stamped and/or bent part made from sheet metal.

4. Apparatus (1) according to claim 1,
characterized in
that the secondary coil element (5) is a resilient element which is designed and arranged between the key cap (3) and the movement mechanism (15) in such a way that mechanical play between the key cap (3) and the movement mechanism (15) is prevented.

5. Apparatus (1) according to claim 4,
characterized in
that the secondary coil element (5) forms a groove and/or a kink (7) for forming as a resilient element, which divides the secondary coil element (5) into two wings which are resiliently movable relative to one another at the groove and/or kink (5), and
in that the two wings are mounted on two outer, opposite edges in the key module (4) or on the movement mechanism (15) in such a way that, in the rest position of the key cap (3) and/or in the actuation position of the key cap (3) and/or during the movement of the key cap (3) between the rest position and the actuation position, the secondary coil element (5) is in contact with both the key cap (3) and the movement mechanism (15) and resiliently clamps them to one another, so that there is no freedom of movement present between the key cap (3) and the movement mechanism (15).

6. Apparatus (1) according to claim 1,
characterized in that
all components of the movement mechanism (15) that are movable relative to the circuit substrate (2), but not the secondary coil element (5), are designed in such a way that no conductive material encloses a continuous recess and/or that no closed current flow can occur around a continuous recess and/or that a ring or frame made of conductive material has a circumferential interruption around a continuous recess.

7. Apparatus (1) according to claim 1,
characterized in
the movement mechanism (15) is a parallel mechanism.

8. Apparatus (1) according to claim 1,
characterized in
that a light source (6) for illuminating the key cap (3) is arranged on the circuit substrate (2) in a region surrounded by the windings of the primary coil (L1), and/or
in that the key module (4) is designed such that light from the rear side of the movement mechanism (15) passes through the movement mechanism (15) and through the continuous recess (13) in the secondary coil element (5) to the key cap (3), and/or
in that a base (16) of the key module (4) and/or the movement mechanism (15) consists at least partially of light-permeable material.

9. Apparatus (1) according to claim 1,
characterized in
that a base (16) of the movement mechanism (15) attached to the circuit substrate (2) and/or a frame element (8) attached to the circuit substrate (2) is designed to protect the movement mechanism (15) and/or a region of the circuit substrate (2) opposite the rear side of the key module (4) and/or one or more light sources (6) and/or electronic components and/or mechanical components and/or connecting devices arranged in a region of the circuit substrate (2) opposite the rear of the key module (4) from environmental influences.

10. Apparatus (1) according to claim 1,
characterized in that
that the primary coil (L1) is a planar coil and/or is arranged on an upper side and/or an underside of the circuit substrate (2) and/or between at least two layers within a multilayer circuit substrate (2).

11. Apparatus (1) according to claim 1,
characterized in that
the measuring device is set up in such a way that when at least one change limit value of the physical variable is reached or exceeded, the at least one electrical signal is output and/or that the signal strength of the at least one electrical signal changes as a function of the change in the physical variable.

12. Apparatus (1) according to claim 11,
characterized in that
the change limit value or the change limit values are adjustable.

13. Apparatus (1) according to claim 11,
characterized in that
the measuring device is set up in such a way that the signal strength of the at least one electrical signal is dependent on the position of the key cap (3) relative to the circuit substrate (2) and thus on the distance between the primary coil (L1) and the secondary coil (L2).

14. Keyboard comprising one or more apparatuses (1) according to claim 1.

15. Keyboard according to claim 14,
characterized in that the keyboard has an underside and an upper side opposite the underside, the underside and/or the upper side being formed from metal or having a metallic layer or a metallic additional layer or a metallic insert.

16. Method for detecting a key press with an apparatus (1) according to claim 1, comprising the steps of:
    a) carrying out an actuating movement of the key cap (3) in such a way that the distance and thus the inductive coupling between the primary coil (L1) and the secondary coil (L2) and thus also at least one physical variable of the resonance circuit (11) changes;
    b) detecting and/or processing the at least one physical variable of the resonance circuit (11) by means of the measuring device, which variable changes due to the movement;
    c) outputting at least one electrical signal when a change limit value of the physical variable is reached or exceeded and/or the signal strength of the at least one electrical signal changes as a function of the change in the physical variable.

17. Method according to claim 16,
    characterized in that
    the resonance circuit (11) is operated with an alternating voltage (U1) of predetermined and/or adjustable frequency and is adjusted in such a way by adjusting or selecting the frequency and/or by adjusting or selecting the capacitance of the capacitor (C1) and/or by adjusting or selecting a resistor arranged in the resonance circuit (11) that the resonance circuit (11) is in the resonance range at a predetermined position of the key cap (3) relative to the circuit substrate (2).

* * * * *